United States Patent
Cave et al.

(10) Patent No.: US 7,211,465 B2
(45) Date of Patent: May 1, 2007

(54) METHOD OF USING CAPACITIVE BONDING IN A HIGH FREQUENCY INTEGRATED CIRCUIT

(75) Inventors: Michael Cave, Pflugerville, TX (US); Michael May, Austin, TX (US); Mathew Rybicki, Austin, TX (US); Timothy Markison, Austin, TX (US)

(73) Assignee: ViXS Systems, Inc., Toronto, Ontario (CA)

( * ) Notice: Subject to any disclaimer, the term of this patent is extended or adjusted under 35 U.S.C. 154(b) by 0 days.

(21) Appl. No.: 11/174,824

(22) Filed: Jul. 5, 2005

(65) Prior Publication Data
US 2005/0245102 A1 Nov. 3, 2005

Related U.S. Application Data

(62) Division of application No. 10/041,318, filed on Jan. 7, 2002.

(51) Int. Cl.
*H01L 21/00* (2006.01)

(52) U.S. Cl. ............ 438/106; 438/107; 438/381; 438/393
(58) Field of Classification Search ........ 438/106–108, 438/121, 381, 393
See application file for complete search history.

(56) References Cited

U.S. PATENT DOCUMENTS 5,777,528 A * 7/1998 Schumacher et al. ......... 333/33
6,140,707 A * 10/2000 Plepys et al. ............... 257/778

* cited by examiner

*Primary Examiner*—Matthew Smith
*Assistant Examiner*—Jarrett J. Stark

(57) ABSTRACT

A method of manufacturing a high frequency integrated circuit begins by positioning a die within a package, wherein the die includes a circuit that processes a high frequency signal and at least one bond pad operably coupled to the circuit, and wherein the package includes a plurality of bond posts, wherein at least one of the plurality of bond posts is allocated to the at least one bond pad. The method continues by bonding a first plate of a capacitor to the at least one bond pad. The method continues by bonding a second plate of the capacitor to the at one of the plurality of bond posts.

8 Claims, 5 Drawing Sheets

METHOD OF USING CAPACITIVE BONDING IN A HIGH FREQUENCY INTEGRATED CIRCUIT

This patent application is claiming priority under 35 USC § 121 as a divisional patent application of co-pending patent application entitled HIGH FREQUENCY INTEGRATED CIRCUIT USING CAPACITIVE BONDING, having a Ser. No. 10/041,318, and a filing date of Jan. 7, 2002.

TECHNICAL FIELD OF THE INVENTION

This invention relates generally to integrated circuits and more particularly to bonding within such integrated circuits.

BACKGROUND OF THE INVENTION

Integrated circuits are known to include one or more die mounted in a package (e.g., a standard package, surface mount package, ball grid array package, flip-chip package, et cetera). Each die includes a plurality of bonding-pads that are coupled, via bonding wires, to bond posts of the package to provide external connectivity to the die or dies. Bonding wires are typically short (e.g., less than 1 centimeter), thin (e.g., less than 30 gage wire), and constructed of aluminum and/or gold to have a small impedance (e.g., less than 0.5 Ohm and 2–20 nano Henries). Thus, for most applications, a bond wire has negligible affects on signals inputted to and/or outputted from the die.

As the frequencies of signals increase, the impedance of a bond wire becomes an issue. For example, at 5 gigahertz, the impedance of a bond wire may be approximately 157 OHMS to 628 OHMS (impedance=$2\pi f L$). For RF transceivers, such a large bond wire impedance makes impedance matching of an antenna via an impedance transformation circuit very difficult.

Therefore, a need exists for a low impedance bonding technique for use in high frequency applications.

DETAILED DESCRIPTION OF A PREFERRED EMBODIMENT

Generally, the present invention provides a high frequency integrated circuit that includes a die, a package and capacitive bond. The die includes a circuit that processes a high frequency signal and also includes at least one bonding pad coupled to the circuit. The package includes a plurality of bonding posts, at least one of the bonding posts is allocated to the at least one bond pad of the die. A bonding capacitor couples the at least one bond pad on the die to the at least one bond post of the package. As such, the bonding of the die to the package is done using a capacitive bond. Thus, for high frequency applications, the impedance of the bonding is reduced in comparison with a bond wire and thus is well suited for high frequency applications.

Figure 1:
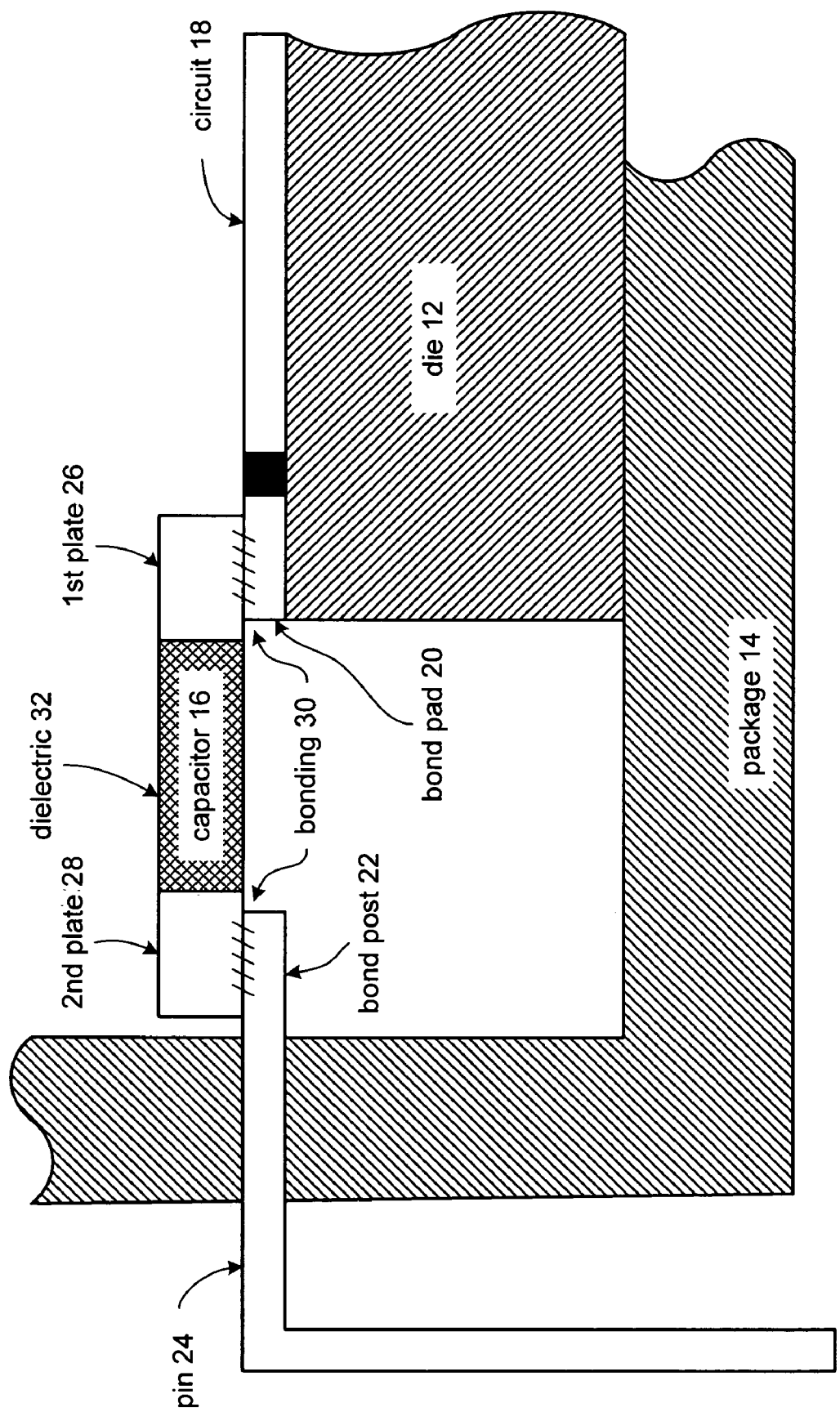
FIG. 1 illustrates a graphical representation of a high frequency integrated circuit in accordance with the present invention.

The present invention can be more fully described with reference to FIGS. 1–8. FIG. 1 illustrates a high frequency integrated circuit 10 that includes a die 12, a package 14, and a capacitor 16. The die 12 includes a circuit 18 and a bonding pad 20. The die 12 may be constructed from silicon, gallium arsenate, or any other type of compound or composition used to produce an integrated circuit. In addition, the die 12 may include multiple metal layers and may have multiple bonding pads associated with each metal layer.

The package 14 includes a plurality of pins 24, where each pin has a corresponding bonding post 22. The capacitor 16 includes a $1^{st}$ plate 26, a $2^{nd}$ plate 28, and a dielectric 32. As illustrated, the $2^{nd}$ plate 28 is bonded 30 to the bonding post 22. As also shown, the $1^{st}$ plate 26 is bonded 30 to the bond pad 20. As such, the circuit 18, which is operably coupled to bonding pad 20, is capacitively coupled to the bonding post 22 and pin 24.

The size of the capacitor 16, both physically and capacitively, is dependent on the particular frequency of use. For example, for a 5 gigahertz signal, and a desire to achieve an effective impedance of 1 OHM, the capacitor 16 has a capacitance value of approximately 31 pico Farads.

As one of average skill in the art will appreciate, the package 14 may be a standard dual inline package, surface mount package, ball grid array package and/or flip-chip package. As one of average skill in the art will also appreciate, the shape of the $1^{st}$ and $2^{nd}$ plates 26 and 28 of capacitor 16 may have geometric configurations other than the shape illustrated in FIG. 1. For example, the $1^{st}$ and $2^{nd}$ plates 26 and 28 may be constructed as an L bracket wherein a major surface of the L couples to the bonding post and/or bonding pad and the other major surface of the L couples to the dielectric 32.

Figure 2:
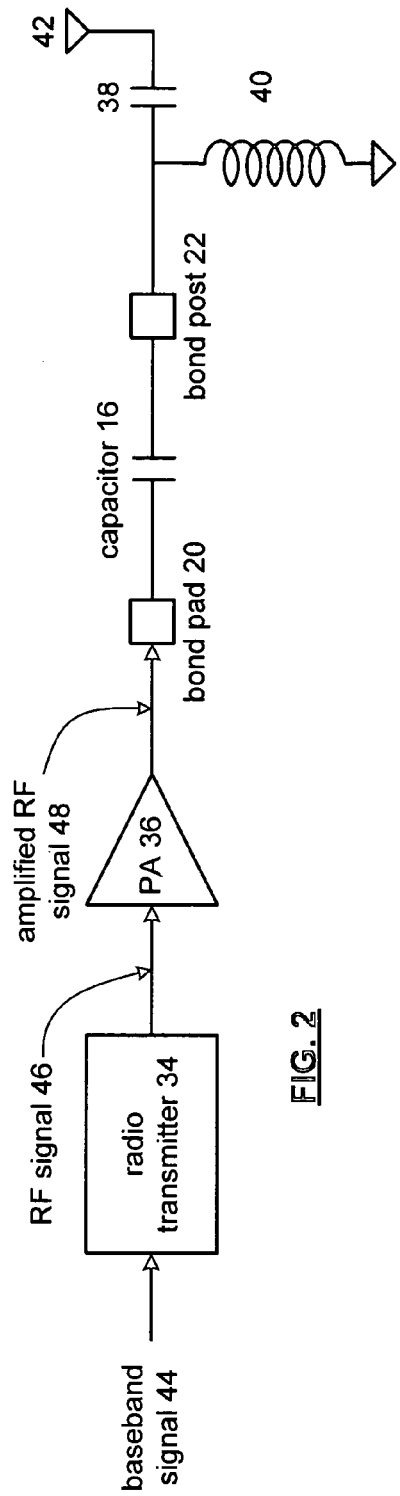
FIG. 2 illustrates a schematic block diagram of a radio transmitter integrated circuit in accordance with the present invention.

FIG. 2 illustrates a schematic block diagram of a high frequency radio transmitter integrated circuit wherein the circuit 18 on die 12 includes a radio transmitter 34 and a power amplifier 36. The radio transmitter 34 is operably coupled to convert a base-band signal 44 into an RF signal 46. The power amplifier 36 is operably coupled to amplify the RF signal 46 to produce an amplified RF signal 48.

The power amplifier 36 provides the amplified RF signal 48 to the bond pad 20 of die 12. Capacitor 16 operably couples the amplified RF signal 48 to the bond post 22 of the package 14. External to the integrated circuit is an inductor 40, a capacitor 38 and an antenna 42. The inductor 40 in combination with capacitor 16 and capacitor 38 form an impedance transformation circuit. Such an impedance transformation circuit is used to match the impedance of the antenna with the output impedance of the power amplifier and may include variable component. Typically, the power amplifier 36 will have an output impedance of approximately 5 OHMS while the antenna will have an input impedance of approximately 50 OHMS. As such, the size of capacitor 16, capacitor 38 and inductor 40 will be sized to provide the desired impedance matching.

Figure 3:
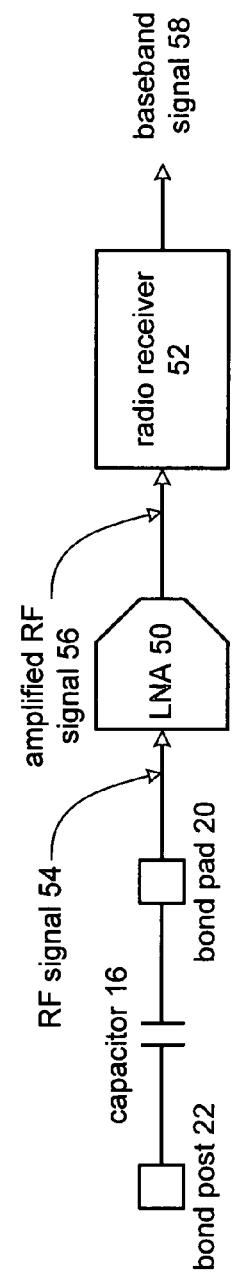
FIG. 3 illustrates a schematic block diagram of a radio receiver integrated circuit in accordance with the present invention.

FIG. 3 illustrates a radio receiver high frequency integrated circuit in accordance with the present invention. The circuit 18 includes a low noise amplifier 50 and a radio receiver 52. The low noise amplifier 50 is operably coupled to bond pad 20 and receives RF signal 54. The low noise amplifier 50 amplifies the RF signal 54 to produce an amplified RF signal 56. The radio receiver 52 converts the amplified RF signal 56 into a base-band signal 58.

Figure 4:
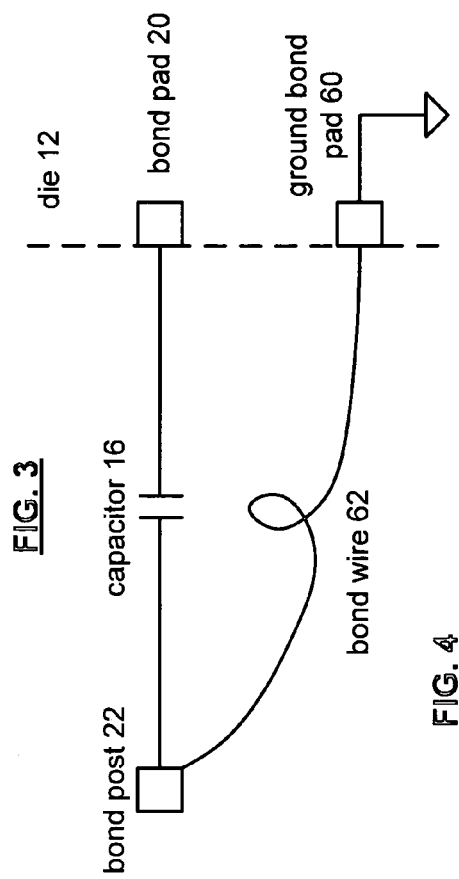
FIG. 4 illustrates a schematic block diagram of an alternate high frequency bonding circuit in accordance with the present invention.

FIG. 4 illustrates a schematic block diagram of a high frequency bonding circuit that includes bonding post 22 of package 14, bonding pad 20 of die 12 and a ground bond pad 60 of die 12. Capacitor 16 is operably coupled between the bond post 22 and the bond pad 20. Bond wire 62 is operably coupled from bond post 22 to the ground bond pad 60 of die 12. In this configuration, the inductance of bond wire 62 and the capacitance of capacitor 16 form a portion of an impedance transformation circuit. To complete the impedance transformation circuit, a capacitor would be externally coupled to bond post 22.

Figure 5:
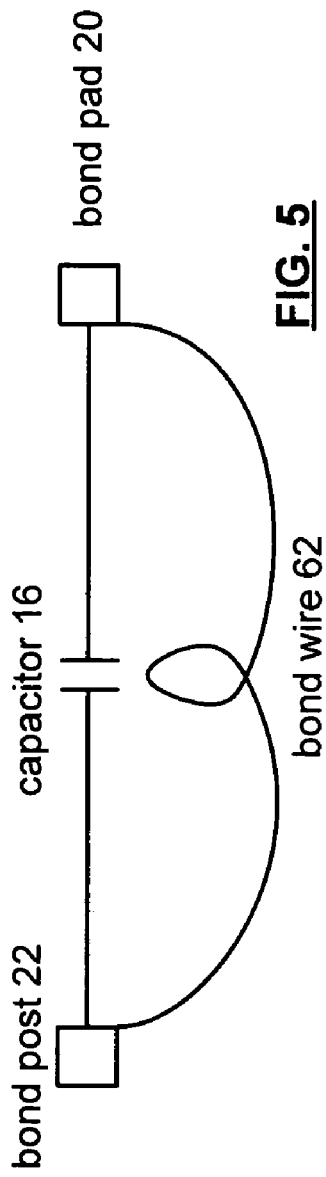
FIG. 5 illustrates a schematic block diagram of another high frequency bonding circuit in accordance with the present invention.

FIG. 5 illustrates a schematic block diagram of a high frequency bonding circuit that includes bond post 22, capacitor 16, bond pad 20 and a bond wire 62. The bond wire 62 is coupled in parallel with capacitor 16 to form a tank circuit. As such, the bond wire 62 in parallel with capacitor 16 may be used as part of a band-pass filter coupled to the output of circuit 18.

Figure 6:
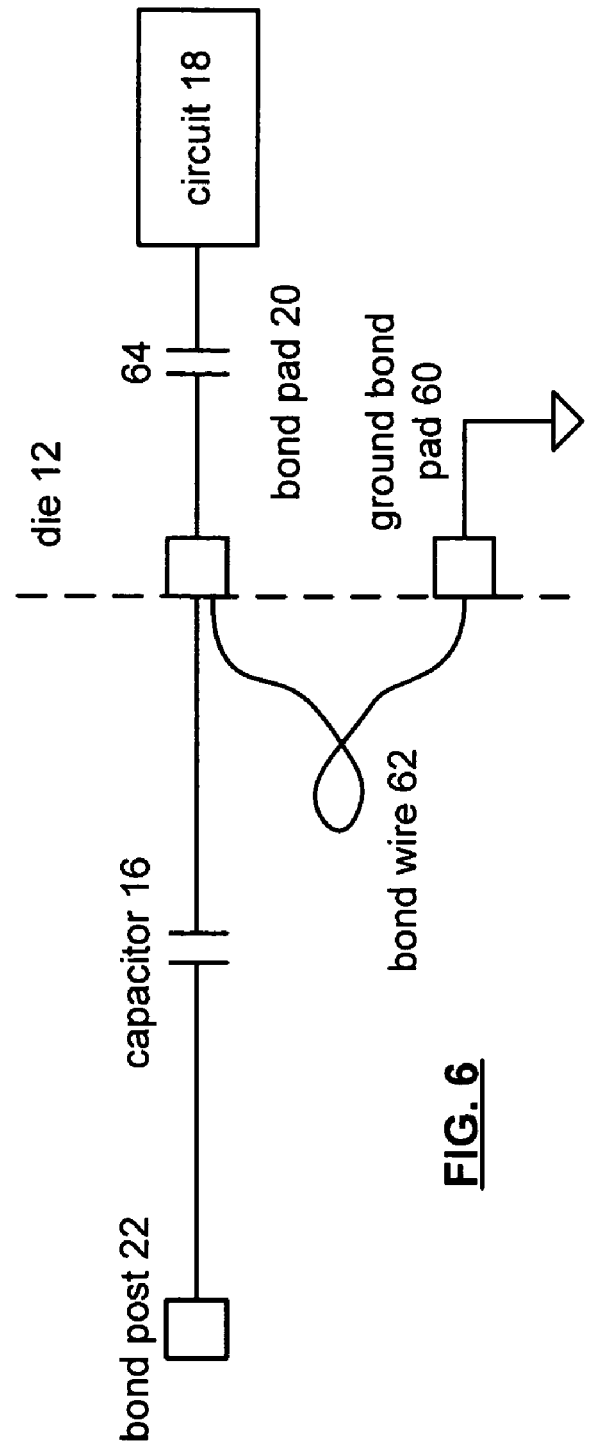
FIG. 6 illustrates a schematic block diagram of yet another embodiment of a high frequency bonding circuit in accordance with the present invention.

FIG. 6 illustrates a schematic block diagram of yet another high frequency bonding circuit. In this circuit, capacitor 16 is coupled between bond post 22 and bond pad 20 of die 12. A capacitor 64 is operably coupled between bond pad 20 and circuit 18. Coupled between bond pad 20 and ground bond pad 60 is bond wire 62. With the inductance of bond wire 62 in combination with the capacitance values of capacitor 16 and capacitor 64, an impedance transformation circuit is realized within the integrated circuit. In such an embodiment, the antenna would be directly coupled to the bond post 22 external to the integrated circuit. As one of average skill in the art will appreciate, the bond post 22, bond pad 20 and bond wire 62 and the $1^{st}$ and $2^{nd}$ plates of capacitor 16 may be comprised of gold and/or aluminum.

Figure 7:
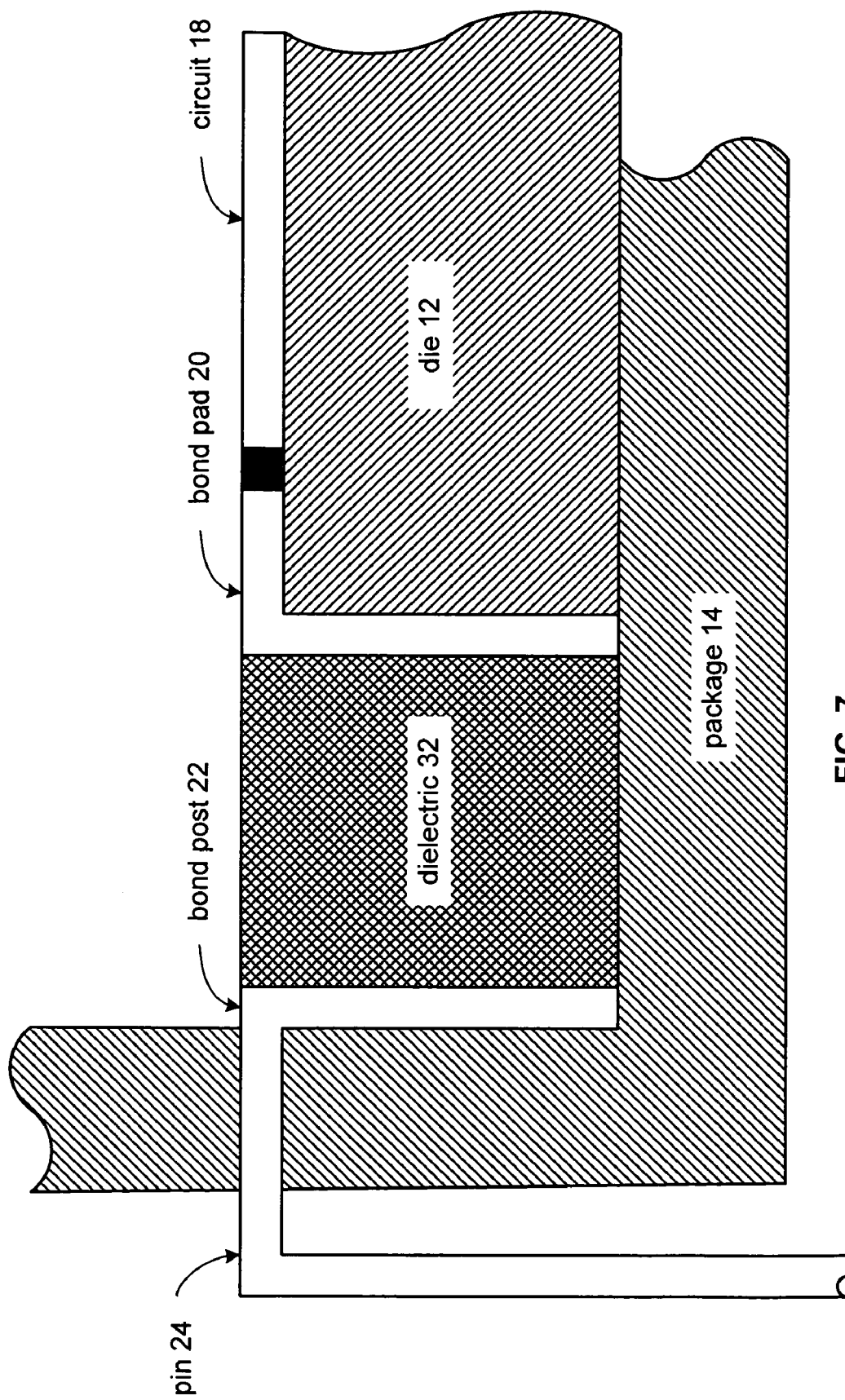
FIG. 7 illustrates a diagram of an alternate embodiment of a high frequency integrated circuit in accordance with the present invention.

FIG. 7 illustrates a high frequency integrated circuit 65 that includes package 14 and die 12. The die 12 includes a circuit 18 and a bond pad 20. The circuit 18 is operably coupled to bond pad 20. As shown, bond pad 20 has an L shape that bends around the die 12. As configured, the bond pad 20 forms a $1^{st}$ plate of a bond capacitor. Note that the shape of the bond pad may extend above the die to provide greater surface area for bond pad 20 thus, allowing the capacitance to be greater.

The package 14 includes pin 24 and corresponding bond post 12. As shown, the bond post 22 has an L shape that bends around the package to form a $2^{nd}$ plate of capacitor 16. Positioned between the bond post 22 and bond pad 20 is a dielectric 32. In this configuration, the bond post 22, the bond pad 20 and the corresponding dielectric 32 form a bonding capacitor. The material used for dielectric 32 will be dependent on the desired capacitance and surface area of bond post 22 and bond pad 20. For example, the dielectric 32 may be air, silicon dioxide, or any other material that exhibits dielectric properties to produce the bonding capacitor.

Figure 8:
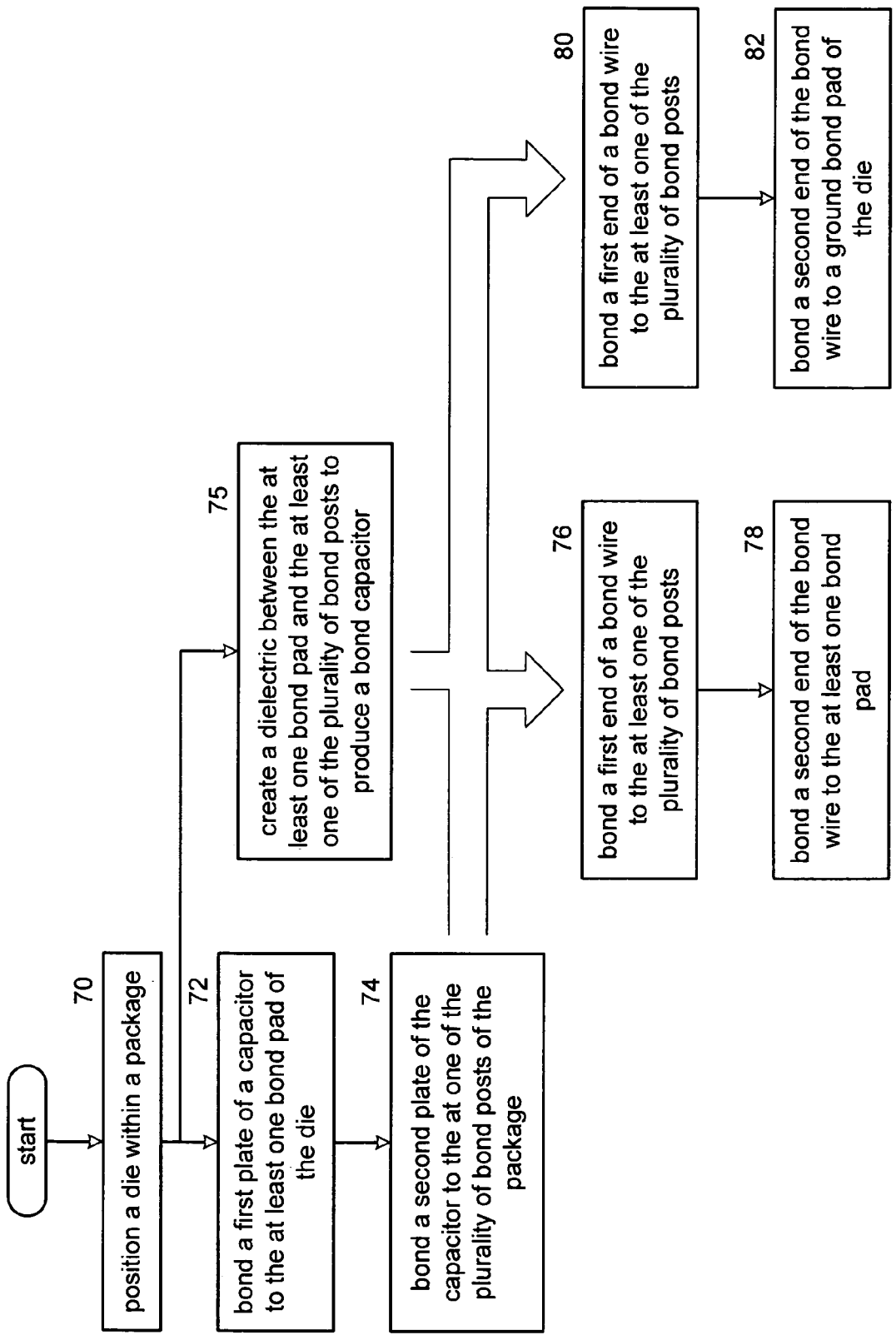
FIG. 8 illustrates a logic diagram of a method for manufacturing a high frequency integrated circuit in accordance with the present invention.

FIG. 8 illustrates a logic diagram of a method for manufacturing a high frequency integrated circuit. The process begins at Step 70 where a die is positioned within a package. The die includes a circuit that processes a high frequency signal and further includes at least one bonding pad operably coupled to the circuit. The package includes a plurality of bonding posts, at least one of which is allocated to the bond pad associated with the circuit.

The process then proceeds to either Step 72 or Step 75. At Step 72, a $1^{st}$ plate of a capacitor is bonded to the at least one bond pad of the die. The bonding may be done by ultrasonic bonding, ionic bonding, thermal compression bonding and/ or any other bonding technique. The process then proceeds to Step 74 where a $2^{nd}$ plate of the capacitor is bonded to the at least one bonding post of the package.

At Step 75, a dielectric is created (e.g., deposited, etched, placed, formed, etc.) between the at least one bond pad in the at least one bond post to produce a bond capacitor. The bond capacitor provides electrical coupling between the circuit and the corresponding bond post.

The high frequency integrated circuit may be further manufactured to include Steps 76 and 78 and/or Steps 80 and 82. At Step 76, a $1^{st}$ end of a bond wire is bonded to the at least one of the plurality of bond posts. The process then proceeds to Step 78 where a $2^{nd}$ end of the bond wire is bonded to the at least one bond pad. In this configuration, the bond wire forms an inductor, which, in combination with the capacitance of the capacitor, forms a tank circuit.

At Step 80, a $1^{st}$ end of a bond wire is bonded to the at least one of the plurality of bond posts. The process then proceeds to Step 82 where a $2^{nd}$ end of the bond wire is bonded to a ground pad of the die. In this configuration, the inductance of the bond wire in combination with the capacitance of the capacitor form at least a portion of an impedance transformation circuit.

The preceding discussion has presented a high frequency integrated circuit that utilizes capacitive bonding to couple a die with pins of a package. As such, high frequency signals may be readily transceived between a die and external connections without significant loss due to bonding wires as in previous integrated circuits. As one of average skill in the art will appreciate, other embodiments may be derived from the teaching of the present invention, without deviating from the scope of the claims.

What is claimed is:

1. A method of manufacturing a high frequency integrated circuit, the method comprises:
   positioning a die within a package, wherein the die includes a circuit that processes a high frequency signal and at least one bond pad operably coupled to the circuit, and wherein the package includes a plurality of bond posts, wherein at least one off the plurality of bond posts is allocated to the at least one bond pad;
   forming a first plate of a capacitor in direct physical contact with the at least one bond pad;
   bonding the first plate of the capacitor to the at least one bond pad;
   forming a second plate of the capacitor in direct physical contact with the at least one of the plurality of bond posts; and
   bonding the second plate of the capacitor to the at one of the plurality of bond posts.

2. The method of claim 1 further comprises:
   bonding a first bond of a bond wire to the at least one of the plurality of bond posts; and
   bonding a second end of the bond wire to a ground bond pad of the die, wherein inductance of the bond wire in combination with capacitance of the capacitor form at least a portion of an impedance transformation circuit.

3. The method of claim 1 further comprises:
bonding a first end of a bond wire to the at least one of the plurality of bond posts; and
bonding a second end of the bond wire to the at least one bond pad such that inductance of the bond wire and capacitance of the capacitor form a tank circuit.

4. The method of claim 1, wherein the bonding of the first and second plate further comprises at least one of:
ultrasonic bonding;
ionic bonding; and
thermal compression bonding.

5. A method of manufacturing a high frequency integrated circuit, the method comprises:
positioning a die within a packaqe, wherein the die includes a circuit that processes a high frequency signal and at least one bond pad operably coupled to the circuit, and wherein the package includes a plurality of bond posts, wherein at least one of the plurality of bond posts is allocated to the at least one bond pad; and
creating a dielectric between the at least one bond pad and the at least one of the plurality of bond posts to produce a bond capacitor that electrically couples the circuit to, and is in direct physical contact with, the at least one of the plurality of bond posts.

6. The method of claim 5 further comprises:
bonding a first end of a bond wire to the at least one of the plurality of bond posts; and
bonding a second end of the bond wire to a ground bond pad of the die, wherein inductance of the bond wire in combination with capacitance of the capacitor form at least a portion of an impedance transformation circuit.

7. The method of claim 5 further comprises:
bonding a first end of a bond wire to the at least one of the plurality of bond posts; and
bonding a second end of the bond wire to the at least one bond pad such that inductance of the bond wire and capacitance of the capacitor form a tank circuit.

8. The method of claim 5, wherein the bonding of the first and second plate further comprises at least one of:
ultrasonic bonding;
ionic bonding; and
thermal compression bonding.

* * * * *